(12) United States Patent
Ren et al.

(10) Patent No.: US 9,000,370 B2
(45) Date of Patent: Apr. 7, 2015

(54) SYSTEM AND METHOD FOR CONTROLLING CHARGE-UP IN AN ELECTRON BEAM APPARATUS

(71) Applicant: Hermes Microvision Inc., Hsinchu (TW)

(72) Inventors: Weiming Ren, San Jose, CA (US); Zhongwei Chen, San Jose, CA (US)

(73) Assignee: Hermes Microvision Inc., Hsinchu (TW)

( * ) Notice: Subject to any disclaimer, the term of this patent is extended or adjusted under 35 U.S.C. 154(b) by 0 days.

(21) Appl. No.: 14/512,672

(22) Filed: Oct. 13, 2014

(65) Prior Publication Data

US 2015/0060665 A1    Mar. 5, 2015

Related U.S. Application Data

(62) Division of application No. 14/081,465, filed on Nov. 15, 2013, now Pat. No. 8,907,281.

(60) Provisional application No. 61/727,806, filed on Nov. 19, 2012.

(51) Int. Cl.
*H01J 37/02*     (2006.01)
*H01J 37/28*     (2006.01)

(52) U.S. Cl.
CPC ............... *H01J 37/026* (2013.01); *H01J 37/28* (2013.01); *H01J 2237/0262* (2013.01)

(58) Field of Classification Search
USPC .......................................... 250/310, 306, 307
See application file for complete search history.

(56) References Cited

U.S. PATENT DOCUMENTS

| | | | |
|---|---|---|---|
| 7,241,993 B2 | 7/2007 | Nakasuji et al. | |
| 2007/0057183 A1* | 3/2007 | Arai et al. | ..... 250/310 |

OTHER PUBLICATIONS

Michael T. Postek in Handbook of Charged Particle Optics, edited by Jon Orloff (CRC Press, Boca Raton, New York, 1997), pp. 373-379.

* cited by examiner

*Primary Examiner* — Kiet T Nguyen
(74) *Attorney, Agent, or Firm* — WPAT, PC; Justin King

(57) ABSTRACT

The present invention provides means and corresponding embodiments to control charge-up in an electron beam apparatus, which can eliminate the positive charges soon after being generated on the sample surface within a frame cycle of imaging scanning. The means are to let some or all of secondary electrons emitted from the sample surface return back to neutralize positive charges built up thereon so as to reach a charge balance within a limited time period. The embodiments use control electrodes to generate retarding fields to reflect some of secondary electrons with low kinetic energies back to the sample surface.

2 Claims, 6 Drawing Sheets

SYSTEM AND METHOD FOR CONTROLLING CHARGE-UP IN AN ELECTRON BEAM APPARATUS

CLAIM OF PRIORITY

This application is a division of U.S. application Ser. No. 14/081,465, filed Nov. 15, 2013, which claims benefit of U.S. provisional application No. 61/727,806, filed Nov. 19, 2012, the entire disclosures of which are incorporated herein by reference.

BACKGROUND OF THE INVENTION

1. Field of the Invention

The present invention relates to an electron beam apparatus which inspects and/or reviews defects on a surface of a sample. More particularly, it relates to a low-voltage scanning electron microscope (LVSEM) with charge-up control for inspecting and/or reviewing defects on a surface of a sample made of substantially insulative material such as wafers or masks in semiconductor manufacturing industry.

2. Description of the Prior Art

In semiconductor manufacturing industry, defects can occur on surfaces of masks and wafers during semiconductor fabrication process. These defects impact yield to a great degree. Apparatuses, which use microscopy to inspect and/or review of defects on a surface of a sample, have been employed to monitor semiconductor manufacturing yield. They are always desired to have high spatial resolution and high throughput. Since critical feature dimensions of patterns on wafers and masks shrunk to ranges where the defects thereon can not be detected out by the photon microscopy, the scanning electron microscopy has been widely adopted. Compared with a photon microscope, a scanning electron microscope (SEM) can detect the defects with smaller sizes due to its higher imaging resolution. However, the incident electron beam (typically called as primary electron beam) of the SEM interacts with the materials of the sample surface and consequently builds a radiation damage and a charge-up (or called as charging) on the sample. The charging may darken, blur and distort the image of the SEM.

The only remedy to reduce radiation damage on the sample surface is to use a low-energy or called as low-voltage electron beam. The lower the energy (Landing Energy) of the primary beam landing on the sample surface is, the less the sample is damaged. In an LVSEM the landing energy is typically lower than 5 keV. Charge-up built on the sample surface results from the difference between the number of incident electrons and the number of emission electrons. FIG. 1, which is cited from the paper in *Handbook of Charged Particle Optics*, edited by Jon Orloff (CRC Press, Boca Raton, New York, 1997), pp. 373-379 by Michael T. Postek, shows the behavior of the total electrons emitted from a sample per unit primary electron with respect to the landing energy, or simply called as total electron yield σ. An amount of net electrical charges will appear on the sample if the yield σ is not equal to 1, and only two landing energy values $E_1$ and $E_2$ correspond to the unity yield. $E_1$ and $E_2$ change with material composition of the sample. Typically, the first energy $E_1$ is below 100 eV and the second energy $E_2$ is about 2-3 keV. Because the inspection or review of defects on wafers or masks is required nondestructive in semiconductor manufacturing, the sample is typically scanned by a primary electron beam having an energy within 0.2~2.5 keV. For this kind application case, a positive charge-up occurs on the sample surface due to the yield σ larger than 1.

On the one hand, the positive charges form a potential barrier. Some secondary electrons (SE) with low emission energies will be reflected back to the sample surface by the potential barrier. The return of the secondary electrons in turn limits the increase in the sample surface potential but directly results in a reduction in the SE detection. On the other hand, the positive charges change the landing energy of the primary electron beam and the local electrostatic field, thereby defocusing and distorting the primary electron beam. As a result, an SE image of the SEM will be darkened, blurred and/or distorted partially or even all over.

Actual charging situation depends on sample conductivity, dwell time and current (probe current) of the primary electron beam on sample surface as well as total electron yield. Several methods are proposed or employed to control charging or mitigate charging effect on an SEM image. One method is to use an advanced scanning strategy for acquiring a frame of image. One example is the interlacing scanning, which scans every odd number of lines during the first pass and every even number of lines during the second pass. Each pass time can allow the charges to dissipate to reach a charge balance so that a charging-effect mitigated image can be obtained. Another example is Leap-scanning, which scans an area (or called as Field of view) at first and then leap to scan a non-adjacent area so as to avoid impact of charge-up built on the former area. Another method is to use a frame cycle of recovery scanning after each frame cycle of imaging scanning. The recovery scanning is different from the imaging scanning in many ways such as the landing energy and/or probe current of the primary electron beam and the size of the scanning area. For example, in the frame cycle of the recovery scanning, the landing energy of the primary electron beam is chosen corresponding to an electron yield smaller than one so as to generate negative charges to neutralize the positive charges generated during the frame cycle of the imaging scanning. Disadvantageously, the existence of the frame cycles of recovery scanning reduces the throughput obviously.

However, as the throughput is required higher, a higher primary beam current or a larger field of view becomes necessary. In this case, more positive charges will be built up on the sample surface and can not dissipate quickly during a frame cycle of imaging scanning, thereby reducing the FOV size used in the foregoing methods. In addition, as the resolution is required higher, the impact of charge-up on image quality (such as distortion) becomes not negligible. Therefore, the charges built up during a frame cycle of imaging scanning needs to be eliminated as soon as possible.

Accordingly, a new LVSEM, which can eliminate charge-up soon after appearing thereby being able to provide higher spatial resolution and higher throughput, is needed.

SUMMARY OF THE INVENTION

The object of this invention is to provide an electron beam apparatus employing LVSEM technology to inspect and/or review sample surface with high resolution and high throughput. By specifically designing and arranging PE beam scanning for imaging and charging control during a frame cycle of imaging scanning in the apparatus, the apparatus can eliminate the charge-up built up within a frame cycle of imaging scanning, thereby providing a charging-free image. Hence, this invention will benefit the applications which require both high throughput and high resolution, such as the defect inspection, defect review and critical dimension measurement in semiconductor yield management.

Accordingly, the invention therefore provides an objective lens of a scanning electron microscope, which comprises a magnetic objective lens, a control electrode between said magnetic objective lens and a surface of a sample to be observed. The control electrode is biased a voltage with respect to the sample. During each period of line-scanning within a frame cycle of imaging scanning, the voltage is set at a first value so as to generate an electrostatic extraction field on the surface. During each period of beam-retracing within the frame cycle of imaging scanning, the voltage is set at a second value so as to generate an electrostatic reflection field above the sample.

A primary electron beam of the scanning electron microscope is not blanked out during that each period of beam-retracing. On the surface, a path of the primary electron beam during that each period of beam-retracing covers a path of the primary electron beam during a latest period of line-scanning. The second value can be chosen so that said electrostatic reflection field reflects a desired amount of secondary electrons emitted from the surface back to the surface to make a charge balance thereon.

The present invention also provides an objective lens of a scanning electron microscope for observing a surface of a sample, which comprises a magnetic objective lens, a first control electrode below the magnetic objective lens, and a second control electrode below the first control electrode and above the surface. The first control electrode and second control electrode are biased a first voltage and a second voltage with respect to the sample respectively. During each period of line-scanning within a frame cycle of imaging scanning, the first voltage and the second voltage are respectively set at a first value u1 and a third value u3 so as to generate an electrostatic extraction field on said surface. During each period of beam-retracing within the frame cycle of imaging scanning, the first voltage and the second voltage are respectively set at a second value u2 and a fourth value u4 so as to generate an electrostatic reflection field above the surface.

A primary electron beam of the scanning electron microscope is not blanked out during that each period of beam-retracing. On the surface, a path of the primary electron beam during that each period of beam-retracing covers a path thereof during a latest period of line-scanning.

The second value u2 and fourth value u4 can be chosen so that the electrostatic reflection field reflects a desired amount of secondary electrons emitted from said surface back to the surface to make a charge balance thereon. The second value u2 can be set equal to the first value u1 so that the electrostatic extraction field and the electrostatic reflection field can be switched by adjusting the second voltage. The fourth value u4 can be set equal to the third value u3 so that the electrostatic extraction field and the electrostatic reflection field can be switched by adjusting the first voltage.

The present invention still provides an objective lens of a scanning electron microscope for observing a surface of a sample, which comprises a magnetic objective lens, a first control electrode under the magnetic objective lens, and a second control electrode under the first control electrode and above the surface. The first control electrode and second control electrode are biased a first voltage and a second voltage with respect to the sample respectively. The second voltage is set at an extractive value so as to generate an electrostatic extraction field on the surface. The first voltage is set at a reflective value so as to generate an electrostatic reflection field to reflect an amount of secondary electrons emitted from the surface back to the surface to make a charge balance thereon.

The present invention further provides an electron beam apparatus which comprises an electron source emitting primary electrons along a direction, a condenser lens below the electron source, a beam-limit aperture plate below the electron source and having at least one opening, a magnetic objective lens below the beam-limit aperture plate and the condenser lens, a control electrode below the magnetic objective lens, a sample stage below the control electrode and supports a sample, a deflection unit above said control electrode, and an electron detector below the beam-limit aperture plate. An interested surface of the sample is placed upwards and the control electrode is biased a voltage with respect to the sample. The direction is an optical axis of the electron beam apparatus and the primary electrons form a primary electron beam. The condenser lens, one opening of the beam-limit aperture plate, the magnetic objective lens, the control electrode, and a hole of the electron detector for the primary electron beam passing therethrough are aligned with the optical axis. The opening of the beam-limit aperture plate limits a current of the primary charged particle beam. The deflection unit deflects the primary electron beam so as to scan the interesting surface in a raster way within a frame cycle of imaging scanning, wherein the frame cycle of imaging scanning comprises a series of alternately distributing periods of line-scanning and beam-retracing. On the interesting surface, a path of the primary electron beam during that each period of beam-retracing covers a path of the primary electron beam during a latest period of line-scanning. The electron detector comprises a detection area facing to the interesting surface so as to collect a first amount of secondary electrons emitted therefrom. The primary electron beam is not blanked out during that each period of beam-retracing. During that each period of line-scanning, the voltage is set at a first value so as to generate an electrostatic extraction field on the interesting surface. During that each period of beam-retracing, the voltage is set at a second value so as to generate an electrostatic reflection field which reflects a second amount of secondary electrons back to the interesting surface to make a charge balance thereon.

The present invention also provides an electron beam apparatus which comprises an electron source emitting primary electrons along a direction, a condenser lens below the electron source, a beam-limit aperture plate below the electron source and having at least one opening, a magnetic objective lens below the beam-limit aperture plate and the condenser lens, a first control electrode below the magnetic objective lens, a second control electrode below the first control electrode, a sample stage below the second control electrode and supporting a sample, a deflection unit above said first control electrode and deflecting the primary electron beam so as to scan an interested surface in a raster way within a frame cycle of imaging scanning, and an electron detector below the beam-limit aperture plate. The direction is an optical axis of the electron beam apparatus and the primary electrons form a primary electron beam. The condenser lens, one opening of the beam-limit aperture plate, the magnetic objective lens, the first control electrode, the second control electrode, and a hole of the electron detector for the primary electron beam passing therethrough are aligned with the optical axis. The opening of the beam-limit aperture plate limits a current of the primary charged particle beam. The interested surface of the sample is placed upwards and the first and second control electrodes are biased a first voltage and a second voltage with respect to the sample respectively. The frame cycle of imaging scanning comprises a series of alternately distributing periods of line-scanning and beam-retracing. On the interested surface, a path of the primary electron beam during that each period of beam-retracing covers a path thereof during a latest period of line-scanning. The electron detector comprises a detection area facing to the interesting surface so as to collect a first amount of secondary electrons emitted therefrom. During that each period of line-scanning, the first voltage and the second voltage are respectively set at a first value and a third value so as to generate an electrostatic extraction field on said surface. During that each period of beam-retracing, the first voltage and the second voltage are respectively set at a second value and a fourth value so as to generate an electrostatic reflection field above said surface.

The present invention still further provides an electron beam apparatus, comprising an electron source emitting primary electrons along a direction, a condenser lens below the electron source, a beam-limit aperture plate below the electron source and having at least one opening, a magnetic objective lens below the beam-limit aperture plate and the condenser lens, a first control electrode below the magnetic objective lens, a second control electrode below the first control electrode, a sample stage below the second control electrode and supporting a sample, a deflection unit above said first control electrode and deflecting the primary electron beam so as to scan an interested surface, and an electron detector below the beam-limit aperture plate. The interested surface of the sample is placed upwards and the first and second control electrodes are biased a first voltage and a second voltage with respect to the sample respectively. The direction is an optical axis of the electron beam apparatus and the primary electrons form a primary electron beam. The condenser lens, one opening of the beam-limit aperture plate, the magnetic objective lens, the first control electrode, the second control electrode, and a hole of the electron detector for the primary electron beam passing therethrough are aligned with the optical axis. The opening of the beam-limit aperture plate limits a current of the primary charged particle beam. The electron detector comprises a detection area facing to the interesting surface so as to collect a first amount of secondary electrons emitted therefrom. The first and second control electrodes are biased a first voltage and a second voltage with respect to the sample respectively. The second voltage is set to generate an electrostatic extraction field on the interesting surface. The first voltage is set to generate an electrostatic reflection field which reflects a second amount of the secondary electrons back to the interesting surface to make a charge balance thereon.

The present invention therefore provides a means to eliminate charges built up on a sample surface as soon as possible so that the apparatus can provide high imaging resolution over a large probe current range and a large field of view.

Accordingly, the invention therefore provides a method for eliminating positive charges on a surface of a sample in a scanning electron microscope, which comprises steps of providing an electrostatic extraction field on the surface during a period of line-scanning, providing an electrostatic reflection field above the surface during a period of beam-retracing immediately next to the period of line-scanning, and providing a primary electron beam of the scanning electron microscope to the surface during the period of beam-retracing. On the surface, a path of the primary electron beam during the period of beam-retracing covers a path of the primary electron beam during the period of line-scanning. The electrostatic reflection field reflects a desired amount of secondary electrons emitted from the surface back to the surface to neutralize positive charges on the surface to reach a charge balance thereon.

The present invention also provides a method for eliminating positive charges on a surface of a sample in a scanning electron microscope, which comprises steps of providing an electrostatic extraction field on the surface and an electrostatic reflection field above the surface simultaneously, wherein the electrostatic reflection field reflects a desired amount of secondary electrons emitted from the surface back to the surface to neutralize positive charges on the surface to reach a charge balance thereon.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein the same or like reference numerals designate the same or like structural elements, and in which.

DETAILED DESCRIPTION OF EXAMPLE EMBODIMENTS

Figure 1:
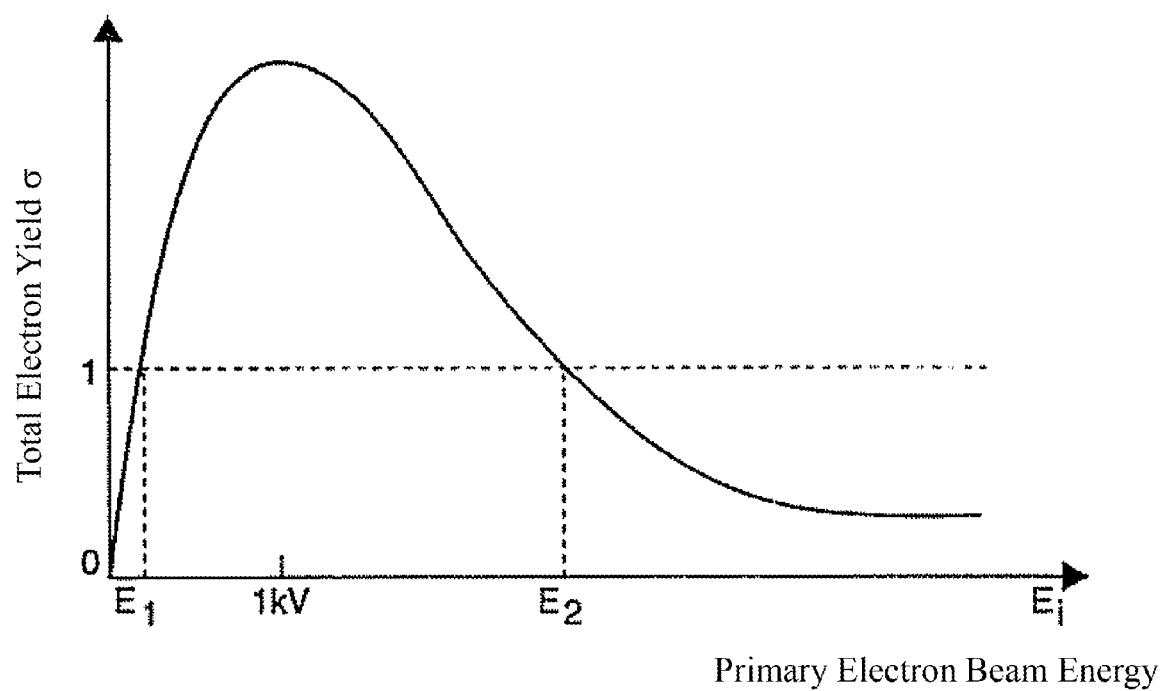
FIG. 1 is a schematic illustration of a general relationship of total electron emission from a sample per unit primary electron and landing energy thereof.

Various example embodiments of the present invention will now be described more fully with reference to the accompanying drawings in which some example embodiments of the invention are shown. In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, X, Y and Z axes form Cartesian coordinate, and a PE beam propagates along Z-axis in +Z direction.

In this invention, "axial" means "in the optical axis direction of an apparatus or a lens" and is in the Z-axis direction, while "radial" means "in a direction perpendicular to the optical axis".

In this invention, an area of a sample is scanned by a focused PE beam in a raster way. "A frame cycle of imaging scanning" comprises a series of periods of line-scanning and beam-retracing. There is a period of beam-retracing between two adjacent periods of line-scanning During a period of beam-retracing, on the sample surface, the focused PE beam is moved from the end of the last scanning line to the beginning of the next scanning line. The acquisition of the SE detection signal will be done during each period of line-scanning and will not be done during each period of beam-retracing. The PE beam may not be blanked out during each period of beam-retracing.

As shown in FIG. 1 and explained in DESCRIPTION OF THE PRIOR ART, a positive charge-up will be built up on a sample surface when the total electron yield σ>1, wherein landing energies of primary electrons are within a range of $E_1 \sim E_2$. The positive charges form a potential barrier and alter the local electrostatic field and potential distribution, thereby resulting in defocusing and/or distortion of the PE beam and a reduction of SE detection signal. The present invention provides two means for controlling charge-up on a surface of a sample in a LVSEM, which can eliminate the positive charges soon after being generated on the sample surface within a frame cycle of imaging scanning. At first, an elementary embodiment of the first means is proposed as a first embodiment of the invention and shown in FIGS. 2A and 2B, FIG. 3, and FIGS. 4A and 4B. Secondly, some other embodiments of the first means are provided and shown in FIGS. 5A and 5B, FIG. 6, FIGS. 7A and 7B. Next, one embodiment of the second means is proposed and shown in FIG. 8. Detailed description and mechanism of the embodiments of the present invention are described next.

The first means is to let some or all of secondary electrons emitted from the sample surface during a period of beam-retracing return back to the sample surface so as to neutralize positive charges built up during a previous period of line-scanning. One elementary embodiment of the first means is shown in FIG. 2A.

Figure 4A:
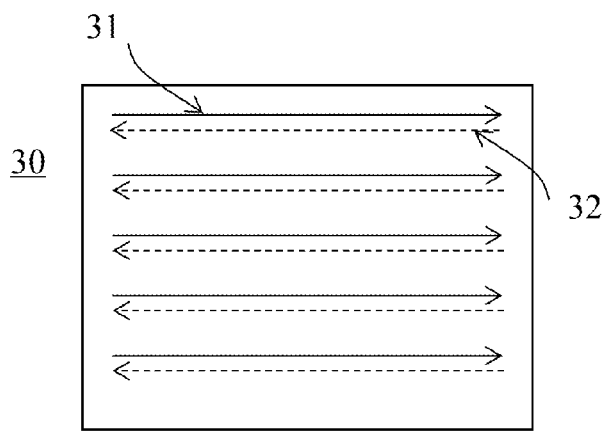
FIGS. 4A and 4B are schematic illustrations of a scanning pattern during a frame cycle of imaging scanning in accordance with one embodiment of the present invention.
Figure 4B:
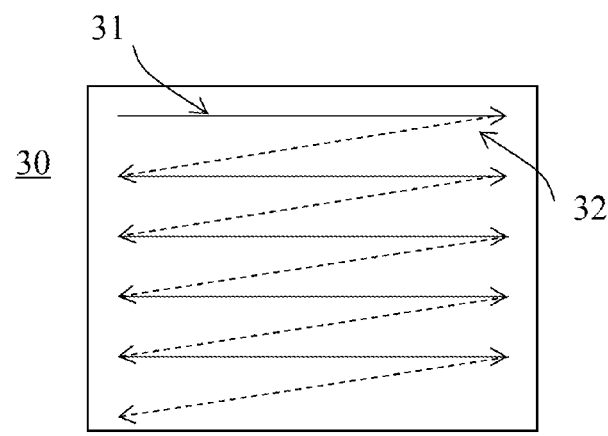

Primary electrons are emitted along the direction of +Z-axis from an electron source 14 and accelerated by an anode 12. The gun aperture 11 cut off the primary electrons with polar angles larger than a specific value and thereby limiting the current of the primary electron beam 21. Then PE beam 21 is focused by the condenser lens 10 and passes the holes of the beam-limit aperture 9 and the SE detector 7. The size of beam-limit aperture 9 and the focusing power of the condenser 10 are selected to control the beam current of the PE beam landing on the surface of the sample 1. After that, the PE beam 21 goes through two deflectors 4 and 6, the magnetic objective lens 3 and the electrode 2 in order, and is finally incident on the surface of the sample 1. The magnetic objective lens 3, the electrode 2 and the sample 1 forms an electromagnetic compound objective lens 100, which focus the PE beam 21 to become a focused probe spot on the sample surface. The two deflectors 4 and 6 together dynamically deflect the PE beam 21 so as to make the focused probe spot scan the sample surface in a raster way as shown in FIG. 4A or FIG. 4B. The illumination of the PE beam 21 will make the sample emit secondary electrons. The beam 22 of the secondary electrons will be focused by the electromagnetic compound objective lens 100 and detected by the detector 7.

Figure 2A:
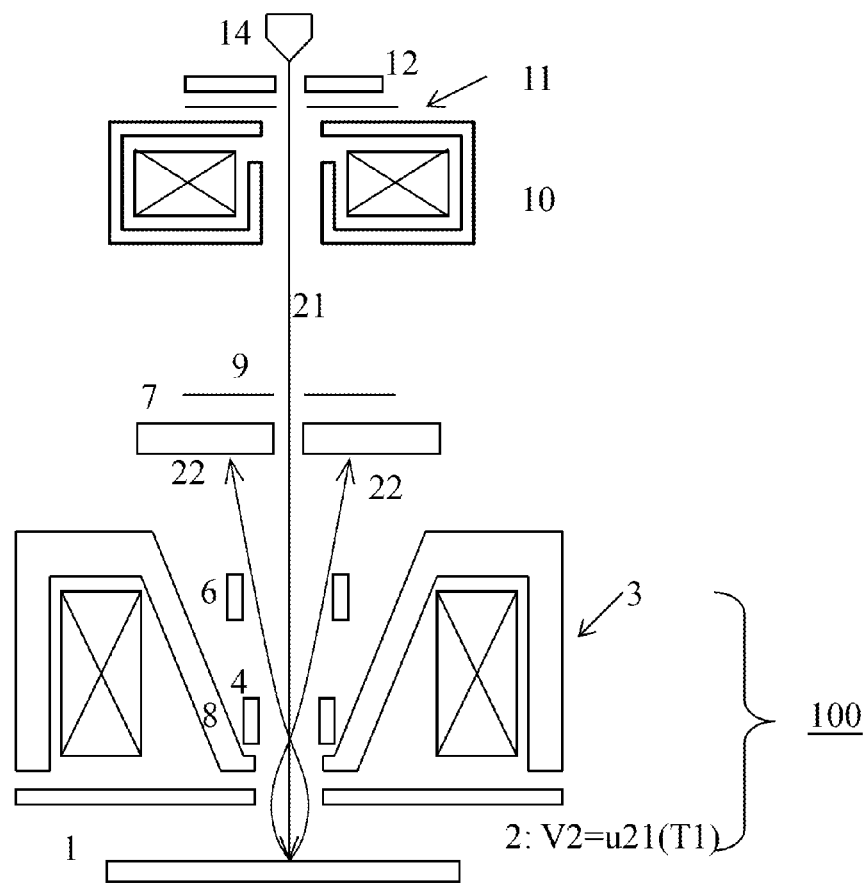
FIGS. 2A and 2B are schematic illustrations of a LVSEM with a charging control means in accordance with one embodiment of the present invention.
Figure 2B:
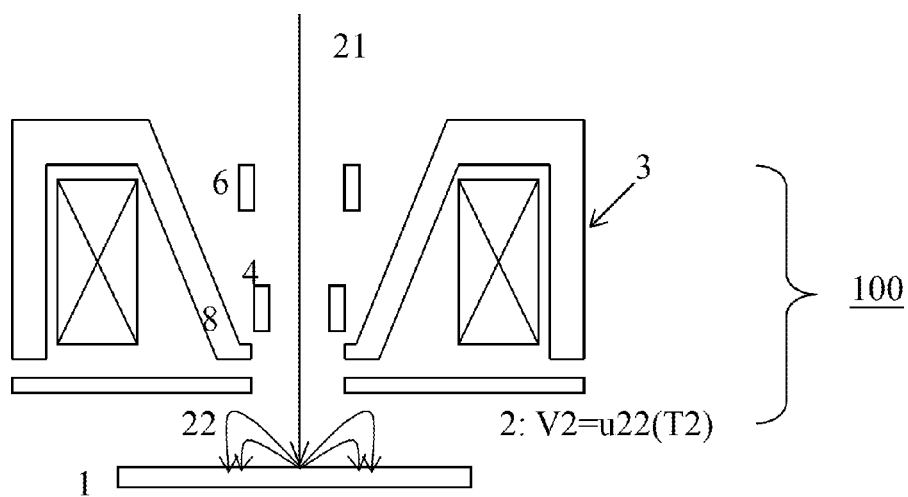
Figure 3:
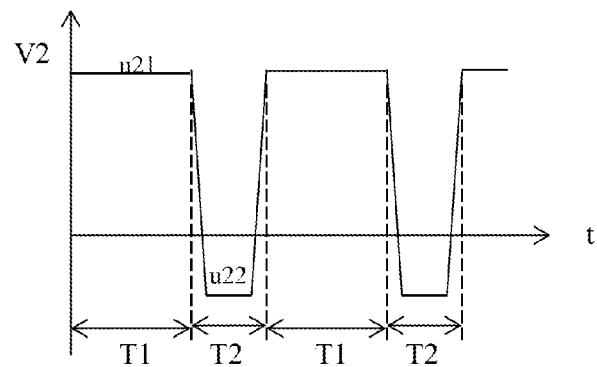
FIG. 3 is a schematic illustration of a potential distribution during a frame cycle of imaging scanning in accordance with the embodiment of the present invention shown in FIGS. 2A and 2B.

In FIGS. 2A and 2B, the electrode 2 is biased a voltage V2 with respect to the sample 1 so as to control the electrostatic field on and near the surface of the sample 1. FIG. 3 shows the change of the voltage V2 within a frame cycle of imaging scanning. On the one hand, a strong electrostatic extraction field is advantageous for getting a better imaging performance such as reducing the size of the focused probe spot and increasing the efficiency of SE collection and detection. For this reason, the bias voltage V2 is set at u21 during each period T1 of line-scanning in a frame cycle of imaging scanning so as to generate the desired strong electrostatic extraction field, as shown in FIG. 2A. On the other hand, a weak electrostatic reflection field is required for reflecting some or all of the secondary electrons back to the sample for neutralizing the positive charges generated during each period T1. For this reason, the bias voltage V2 is set at u22 during each period T2 of beam-retracing in the frame cycle of imaging scanning so as to generate the desired weak electrostatic reflection field as shown in FIG. 2B where the SE beam 22 is reflected back to sample 1.

For the PE beam in FIG. 2B, to make the neutralization happen, each beam-retracing path is preferred to reverse its immediately previous line-scanning path as shown in FIG. 4A. In FIG. 4A, for a scanning area 30 on the sample surface during a frame cycle of imaging scanning, each beam-retracing path 32 (in dash line) reverses its previous line-scanning path 31 (in solid line). For the sake of the clarity, the beam-retracing path 32 is shown separated from the line-scanning path 31, and however both should be coincident with each other. FIG. 4B shows another pattern of line-scanning paths and beam-retracing paths.

The difference between u21 and u22 depends on the strength difference between the desired electrostatic extraction field and the desired electrostatic reflection field, and the configuration of the inner portions of the inner pole-piece 8 and the electrode 2. The configuration is usually designed to image with small aberrations over a large FOV as much as possible, and therefore usually corresponds to a large difference between u21 and u22, such as 5 kV. In order not to influence the throughput obviously, it is better to avoid taking much time for V2 changing from u21 to u22. However, it will cost much for making electronics to adjust V2 in a large range quickly.

Figure 5A:
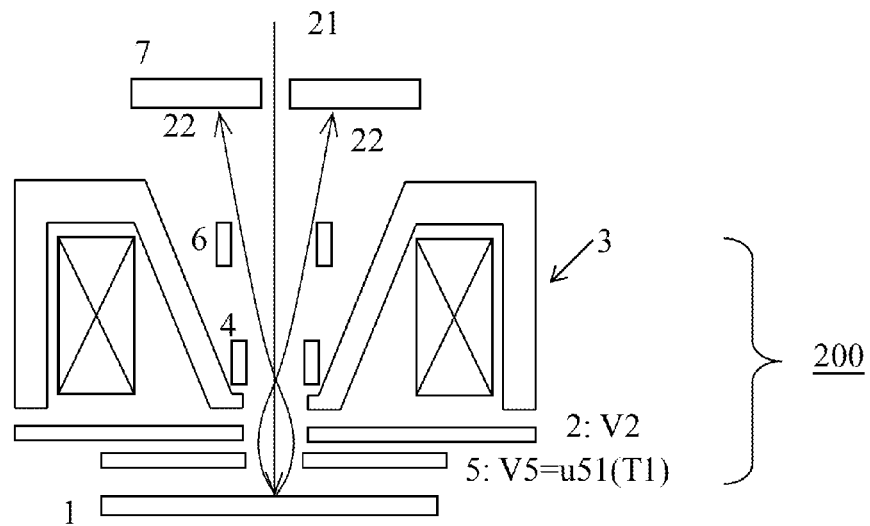
FIGS. 5A and 5B are schematic illustrations of a LVSEM with a charging control means in accordance with one embodiment of the present invention.
Figure 5B:
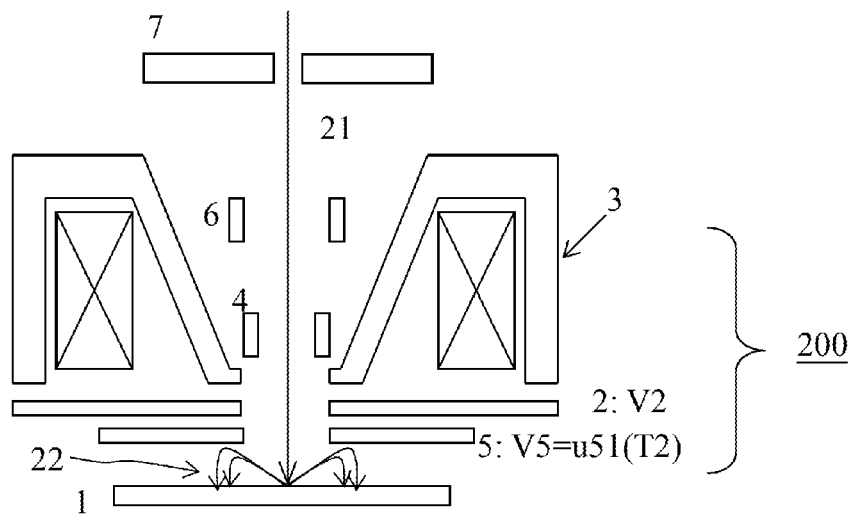
Figure 6:
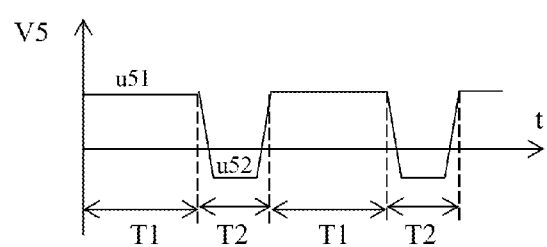
FIG. 6 is a schematic illustration of a potential distribution during a frame cycle of imaging scanning in accordance with the embodiment of the present invention shown in FIGS. 5A and 5B.

Accordingly, the present invention proposes one embodiment with a small voltage variation for charging control, which is shown in FIGS. 5A and 5B. For the sake of brevity and simplicity of demonstration, only the components below the beam-limit aperture 9 of FIG. 2A are shown in FIGS. 5A and 5B. In FIGS. 5A and 5B, another electrode 5 is added and biased a voltage V5 with respect to the sample 1 for controlling the electrostatic field on and near the surface of the sample 1, and the electromagnetic compound objective lens 200 comprises the magnetic objective 3, the electrodes 2 and 5 and the sample 1. The electrode 5 is between the electrode 2 and the sample 1 and configured to not impact on the imaging properties (such as spot size and FOV). For the configuration, the voltages V2 and V5 of the electrodes 2 and 5 can be chosen to generate a desired electrostatic extraction field during each period T1 of line-scanning and a desired electrostatic reflection field during each period T2 of beam-retracing by switching V5 between u51 and u52, as shown in FIG. 6. The difference between u51 and u52 is much smaller than the difference between u21 and u22 in FIG. 2, such as one-tenth.

The voltage V2 can be fixed within a frame cycle of imaging scanning. Accompanying with the switching of the voltage 5, if the voltage V2 is also switched between two slightly different values so as to generate a desired electrostatic extraction field during each period T1 of line-scanning and a desired electrostatic reflection field during each period T2 of beam-retracing, the difference between u51 and u52 can be further reduced.

Figure 7A:
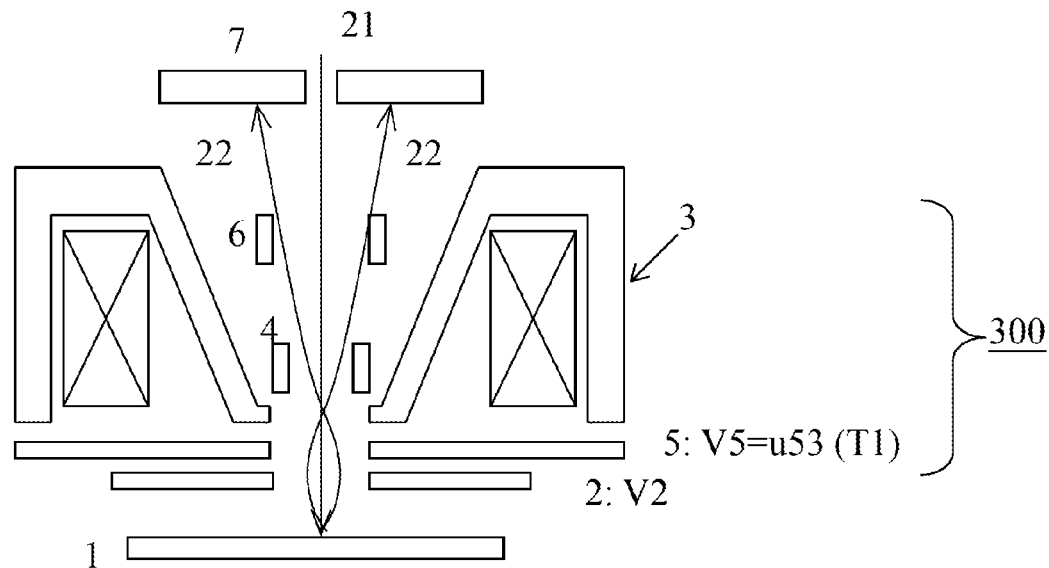
FIGS. 7A and 7B are schematic illustrations of a LVSEM with a charging control means in accordance with one embodiment of the present invention.
Figure 7B:
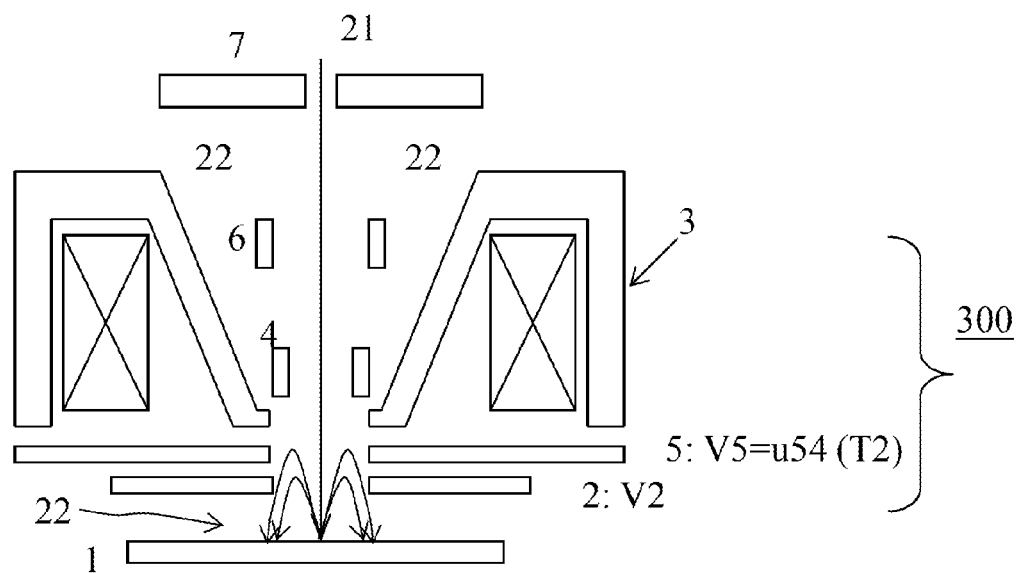

In the foregoing embodiments, the electrostatic field on the sample surface changes dramatically when switching from each period T1 to the next period T2, i.e. from a strong electrostatic extraction field to a weak electrostatic reflection field. Some samples can not suffer such a large change in electrostatic field strength. For those samples, it is better to keep the same electrostatic field on the sample surface during a frame cycle of imaging scanning. Accordingly, the present invention proposes one embodiment which can control charging on the sample surface and only generate a small or even zero strength change of the electrostatic field on the sample surface when switching from each period T1 to the next period T2. The embodiment is shown in FIGS. 7A and 7B. For the sake of brevity and simplicity of demonstration, only the components below the beam-limit aperture 9 of FIG. 2A are shown in FIGS. 7A and 7B. Different from the embodiment shown in FIGS. 5A and 5B, in this embodiment the electrode 5 is above the electrode 2. The electrode 2 and the electrode 5 are biased voltages V2 and V5 with respect to the sample 1 respectively. The electromagnetic compound objective lens 300 comprises the magnetic objective 3, the electrodes 2 and 5 and the sample 1. In FIGS. 7A and 7B, the voltages V2 and V5 of the electrodes 2 and 5 are chosen to generate a desired electrostatic extraction field on the surface of the sample 1 during each period T1 of line-scanning and a desired electrostatic reflection field located above the electrode 2 during each period T2 of beam-retracing by only switching V5 between two values or switching both V2 and V5 between respective two values. The setting of the voltages V2 and V5 is better to make the strength change of the electrostatic field on the surface of the sample 1 as small as possible.

Figure 8:
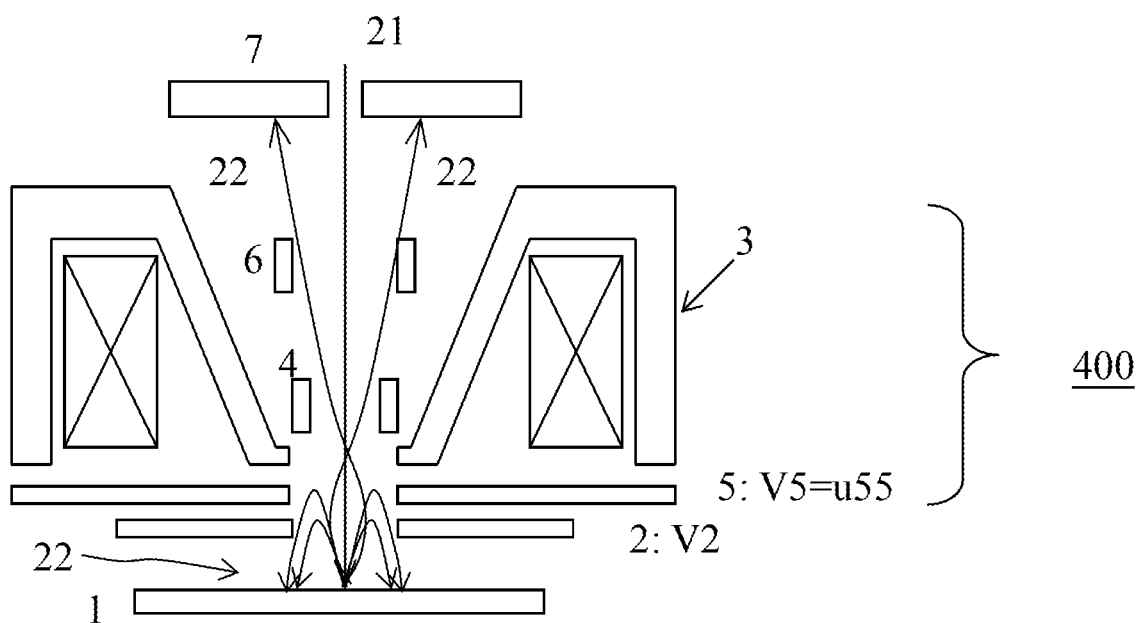
FIG. 8 is a schematic illustration of a LVSEM with a charging control means in accordance with one embodiment of the present invention

The second means is to let some of secondary electrons emitted from the sample surface with low kinetic energies return back to the sample surface during a period of line-scanning to make the short-term average of the total electron yield σ nearly equal to 1. Accordingly, the present invention proposes one embodiment which can realize both of charge-up control and generating an electrostatic extraction field on the sample surface during each period T1 of line-scanning. The embodiment is shown in FIG. 8. For the sake of brevity and simplicity of demonstration, only the components below the beam-limit aperture 9 of FIG. 2A are shown in FIG. 8. Similar to the embodiment shown in FIGS. 7A and 7B, in this embodiment the electrode 5 is above the electrode 2 and the electrode 2 and the electrode 5 are biased voltages V2 and V5 with respect to the sample 1 respectively. The electromagnetic compound objective lens 400 comprises the magnetic objective 3, the electrodes 2 and 5 and the sample 1. The voltages V2 and V5 are respectively fixed at a specific value during a frame cycle of imaging scanning so as to simultaneously generate a desired electrostatic extraction field on the sample surface for getting better imaging performance and a desired electrostatic reflection field above the sample surface for reflecting some low-energy secondary electrons back to neutralize the positive charges on the sample surface. Although the landing energy of the PE beam 21 corresponds to a large-than-1 total electron yield a of the sample as shown in FIG. 1, the combination of the initial total electron yield σ and the return of some secondary electrons makes the number of the electrons which finally are able to escape from the sample surface per unit primary electron, which is called as a compound yield σ+, can approach 1.

In summary this invention provides two means for controlling charge-up on a surface of a sample in a LVSEM, which can eliminate the positive charges soon after being generated on the sample surface within a frame cycle of imaging scanning. The first means is to let some or all of secondary electrons emitted from the sample surface during a period of beam-retracing return back to the sample surface so as to neutralize positive charges built up during a previous period of line-scanning. The second means is to let some of secondary electrons emitted from the sample surface with low kinetic energies return back to the sample surface during a period of line-scanning to make the short-term average of the total electron yield a (i.e. compound yield) nearly equal to 1. Accordingly, several embodiments employing the foregoing means are provided. The embodiments based on the first means provide a desired electrostatic extraction field during a period of line-scanning and a reflecting field during a period of beam-retracing, while the embodiment based on the second means simultaneously provides both the desired electrostatic extraction field and reflecting field during a period of line-scanning.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended

What is claimed is:

1. A method for eliminating positive charges on a surface of a sample in a scanning electron microscope, comprising:
   providing an electrostatic extraction field on said surface during a period of line-scanning;
   providing an electrostatic reflection field above said surface during a period of beam-retracing immediately next to said period of line-scanning;
   providing a primary electron beam of said scanning electron microscope to said surface during said period of beam-retracing,
   wherein, on said surface, a path of said primary electron beam during said period of beam-retracing covers a path of said primary electron beam during said period of line-scanning,
   wherein said electrostatic reflection field reflects a desired amount of secondary electrons emitted from said surface back to said surface to neutralize positive charges on said surface to reach a charge balance thereon.

2. A method for eliminating positive charges on a surface of a sample in a scanning electron microscope, comprising:
   providing an electrostatic extraction field on said surface and an electrostatic reflection field above said surface simultaneously,
   wherein said electrostatic reflection field reflects a desired amount of secondary electrons emitted from said surface back to said surface to neutralize positive charges on said surface to reach a charge balance thereon.

* * * * *